(12) United States Patent
Iannotti et al.

(10) Patent No.: US 8,686,725 B2
(45) Date of Patent: Apr. 1, 2014

(54) SYSTEM AND APPARATUS FOR FREQUENCY TRANSLATION OF MAGNETIC RESONANCE (MR) SIGNALS

(75) Inventors: Joseph Iannotti, Glenville, NY (US);
Thomas K. F. Foo, Clifton Park, NY (US); Steven Go, Brooklyn, NY (US);
Kevin Dufel, Tribes Hill, NY (US)

(73) Assignee: General Electric Company, Schenectady, NY (US)

( * ) Notice: Subject to any disclaimer, the term of this patent is extended or adjusted under 35 U.S.C. 154(b) by 1222 days.

(21) Appl. No.: 12/493,600

(22) Filed: Jun. 29, 2009

(65) Prior Publication Data
US 2010/0329527 A1    Dec. 30, 2010

(51) Int. Cl.
*G01V 3/00*    (2006.01)
*G01R 33/20*    (2006.01)

(52) U.S. Cl.
USPC .......... 324/307; 324/309; 324/318; 324/322; 600/410

(58) Field of Classification Search
USPC .......... 324/300–322, 407–464; 600/407–464
See application file for complete search history.

(56) References Cited

U.S. PATENT DOCUMENTS

| | | | | |
|---|---|---|---|---|
| 4,737,713 A | * | 4/1988 | Danby et al. | 324/307 |
| 4,859,950 A | | 8/1989 | Keren | |
| 5,243,288 A | * | 9/1993 | Mori | 324/322 |
| 5,272,437 A | * | 12/1993 | Wardenier | 324/322 |
| 5,384,536 A | * | 1/1995 | Murakami et al. | 324/309 |
| 6,313,630 B1 | * | 11/2001 | Ganin et al. | 324/312 |
| 6,593,744 B2 | | 7/2003 | Burl et al. | |
| 7,449,886 B2 | | 11/2008 | Buchwald | |
| 2009/0067697 A1 | | 3/2009 | Stormont et al. | |
| 2009/0286478 A1 | * | 11/2009 | Biber et al. | 455/41.2 |

* cited by examiner

*Primary Examiner* — Jermele M Hollington
*Assistant Examiner* — Emily Chan
(74) *Attorney, Agent, or Firm* — The Small Patent Law Group; Evan R. Sotiriou; Jenifer E. Ward

(57) ABSTRACT

An apparatus includes a first magnetic resonance (MR) coil element configured to output a first set of MR data at a first output frequency and a first mixer coupled to the first MR coil element. The first mixer is configured to receive the first set of MR data from the first MR coil element and frequency translate the first set of MR data to a first offset frequency different from the first output frequency by a first offset value. The apparatus also includes a digitizer coupled to the first mixer and configured to convert the frequency-translated first set of MR data into a set of digital data and a transmission line coupled to the first mixer and to the digitizer, the transmission line configured to transmit the frequency-translated first set of MR data from the MR coil element to the digitizer without a balun coupled to the transmission line.

15 Claims, 3 Drawing Sheets

SYSTEM AND APPARATUS FOR FREQUENCY TRANSLATION OF MAGNETIC RESONANCE (MR) SIGNALS

BACKGROUND OF THE INVENTION

The present invention relates generally to magnetic resonance (MR) imaging systems and, more particularly, to an RF receiver assembly capable of translating multiple channels of MR signals across a single readout cable. The present invention is particularly applicable with multi-coil architectures.

When a substance such as human tissue is subjected to a uniform magnetic field (polarizing field B0), the individual magnetic moments of the spins in the tissue attempt to align with this polarizing field, but precess about it in random order at their characteristic Larmor frequency. If the substance, or tissue, is subjected to a magnetic field (excitation field B1) which is in the x-y plane and which is near the Larmor frequency, the net aligned moment, or "longitudinal magnetization", MZ, may be rotated, or "tipped", into the x-y plane to produce a net transverse magnetic moment Mt. A signal is emitted by the excited spins after the excitation signal B1 is terminated and this signal may be received by a receive coil(s) and processed to form an image.

When utilizing these signals to produce images, magnetic field gradients (Gx, Gy, and Gz) are employed. Typically, the region to be imaged is scanned by a sequence of measurement cycles in which these gradients vary according to the particular localization method being used. The resulting set of received NMR signals are digitized and processed to reconstruct the image using one of many well known reconstruction techniques.

A radio frequency (RF) coil assembly having one or more receive coils is used to sample the "echo" induced by application of magnetic field gradients and excitation pulses. Each receive coil samples the echo or MR signal and transmits the signal via an RF transmitter to an RF receiver. Each receive channel of the RF receiver then translates the acquired signal to a processing system that formats the signal into a data stream that is fed to a data acquisition system (DAS) for image reconstruction.

RF coils are generally connected to the RF transmitter and/or the RF receiver of the magnetic resonance system using coaxial cable. Coaxial cable is designed to protect the system from picking up extraneous RF signals which are present in the environment. Coaxial cables feature a surrounding shield or ground conductor separated from a current carrying central conductor by a dielectric material. The surrounding ground conductor acts as a shield that minimizes the pick-up of foreign frequencies by the central conductor of the cable.

Although coaxial cable is used, there are still coupling issues at resonance frequencies, such as 63 MHz for hydrogen dipoles in a 1.5 T B0 field. Among other things, the shield conductor of the coaxial cable itself tends to carry foreign induced currents, such as from TV transmissions, stray harmonics from the gradient pulse oscillators and clocking circuits in nearby equipment, and the like. The induced current is often referred to as "skin current" because it flows on the outside of the shield conductor. The stray RF current tends to flow out of the bore and into other circuits, such as the amplifiers, analog-to-digital converters, receivers, and reconstruction processor to contribute errors in the resultant image.

Balance/unbalance ("balun") circuitry, common mode chokes, and/or cable traps are typically used for reducing, or "trapping," the noise and/or stray RF currents generated due to induced currents in the coaxial cable. Baluns typically comprise an LC frequency filter for each cable located in a copper shielded box. Since baluns are resonators, they must be manually tuned to the frequency of interest to filter out or prevent the induced currents from disturbing the delicate data measurements.

The use of baluns presents several disadvantages. For example, the manual tuning process for the baluns is typically time consuming and operator intensive, thus increasing the cost and complexity of the imaging system. Also, baluns generate a significant amount of heat. In addition, baluns are useful only over a narrow frequency range. While this narrow range may be sufficient for some imaging techniques, this inherent limitation of current baluns may prove problematic for use with MNS and multi-nuclear imaging and coil design.

It would therefore be desirable to have a system and apparatus that overcomes the aforementioned drawbacks of baluns by filtering or preventing induced or stray RF currents without a balun.

BRIEF DESCRIPTION OF THE INVENTION

The present invention is directed to a system and apparatus for frequency translation of MR signals.

Therefore, in accordance with one aspect of the present invention, an apparatus includes a first magnetic resonance (MR) coil element configured to output a first set of MR data at a first output frequency and a first mixer coupled to the first MR coil element. The first mixer is configured to receive the first set of MR data from the first MR coil element and frequency translate the first set of MR data to a first offset frequency different from the first output frequency by a first offset value. The apparatus also includes a digitizer coupled to the first mixer and configured to convert the frequency-translated first set of MR data into a set of digital data and a transmission line coupled to the first mixer and to the digitizer, the transmission line configured to transmit the frequency-translated first set of MR data from the MR coil element to the digitizer without a balun coupled to the transmission line.

In accordance with another aspect of the present invention, an MR system includes a magnetic resonance imaging (MRI) apparatus having a plurality of gradient coils positioned about a core of a magnet to impress a polarizing magnetic field and an RF transceiver system and an RF switch controlled by a pulse module to transmit RF signals to a balun-less RF coil assembly to acquire MR images. The balun-less RF coil assembly includes a plurality of RF coils and a frequency translating element, which is configured to receive an MR signal from an RF coil of the plurality of RF coils and alter a frequency of the MR signal by an offset from the frequency of the MR signal. The MR system also includes a combiner configured to receive the frequency-altered MR signal, a balun-less transmission line configured to filter the frequency-altered MR signal, and a digitizer configured to receive the frequency-altered MR signal from the balun-less transmission line.

In accordance with yet another aspect of the present invention, a method of manufacturing an apparatus includes providing a first magnetic resonance (MR) coil element configured to output a first set of MR data at a first frequency. The method also includes coupling a first mixer to the first MR coil element and configuring the first mixer to receive the first set of MR data from the first MR coil element and frequency translate the first set of MR data to a first offset frequency different from the first frequency by a first offset value. The method further includes coupling a digitizer to the first mixer and configuring the digitizer to convert the frequency-translated first set of MR data into a set of digital data, coupling a transmission line to the first mixer and to the digitizer, and configuring the transmission line to transmit the frequency-translated first set of MR data from the MR coil element to the digitizer without a balun coupled to the transmission line.

Various other features and advantages of the present invention will be made apparent from the following detailed description and the drawings.

BRIEF DESCRIPTION OF THE DRAWINGS

The drawings illustrate embodiments presently contemplated for carrying out embodiments of the invention.

In the drawings.

DETAILED DESCRIPTION OF THE INVENTION

Embodiments of the invention are directed to a system and apparatus for frequency translating and filtering an MR signal for balun-less imaging.

Figure 1:
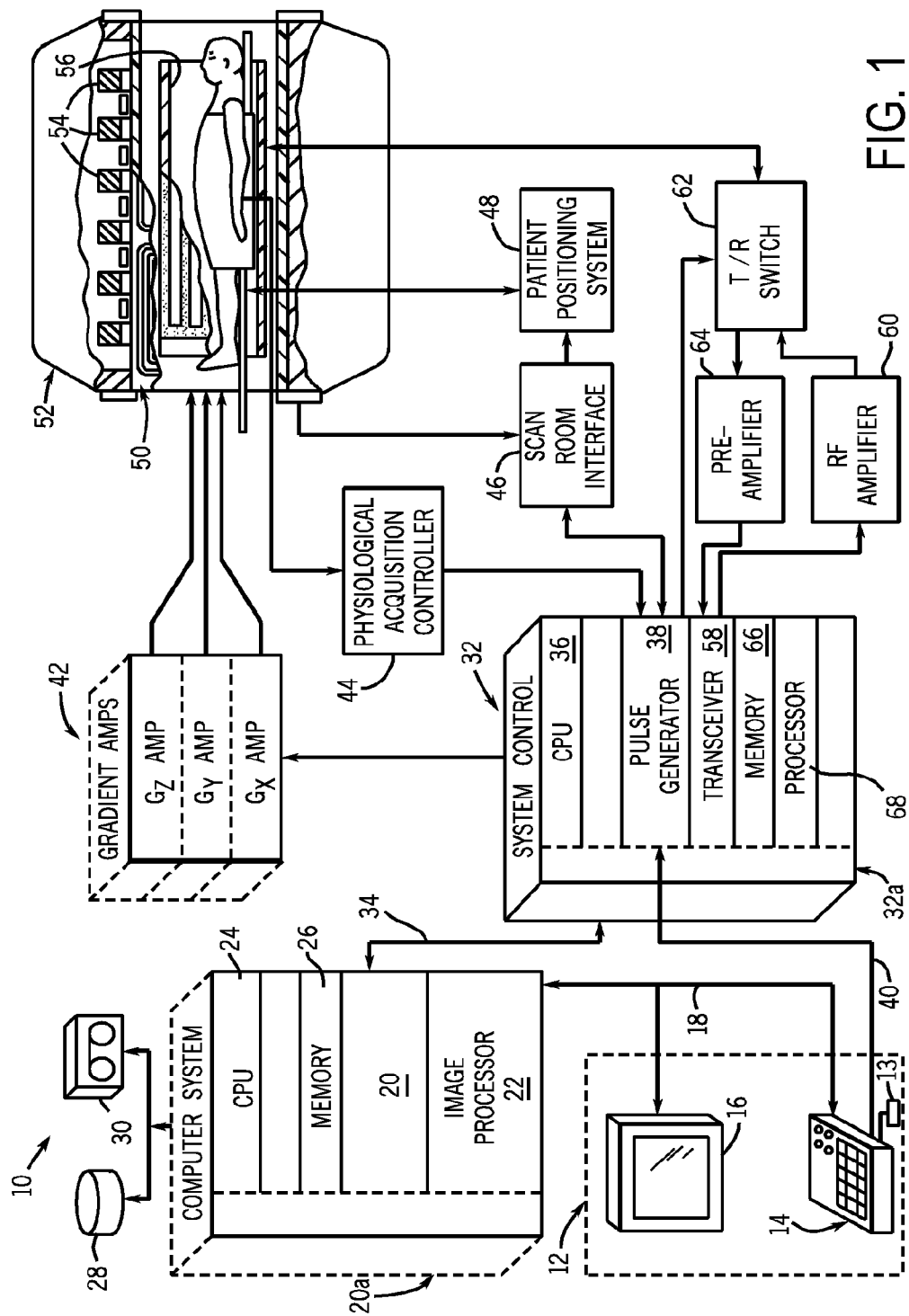
FIG. 1 is a schematic block diagram of an MR imaging system according to an embodiment of the invention.

Referring to FIG. 1, the major components of a preferred magnetic resonance imaging (MRI) system 10 incorporating the present invention are shown. The operation of the system is controlled from an operator console 12 which includes a keyboard or other input device 13, a control panel 14, and a display screen 16. The console 12 communicates through a link 18 with a separate computer system 20 that enables an operator to control the production and display of images on the display screen 16. The computer system 20 includes a number of modules which communicate with each other through a backplane 20a. These include an image processor module 22, a CPU module 24 and a memory module 26, known in the art as a frame buffer for storing image data arrays. The computer system 20 is linked to disk storage 28 and tape drive 30 for storage of image data and programs, and communicates with a separate system control 32 through a high speed serial link 34. The input device 13 can include a mouse, joystick, keyboard, track ball, touch activated screen, light wand, voice control, or any similar or equivalent input device, and may be used for interactive geometry prescription.

The system control 32 includes a set of modules connected together by a backplane 32a. These include a CPU module 36 and a pulse generator module 38 which connects to the operator console 12 through a serial link 40. It is through link 40 that the system control 32 receives commands from the operator to indicate the scan sequence that is to be performed. The pulse generator module 38 operates the system components to carry out the desired scan sequence and produces data which indicates the timing, strength and shape of the RF pulses produced, and the timing and length of the data acquisition window. The pulse generator module 38 connects to a set of gradient amplifiers 42, to indicate the timing and shape of the gradient pulses that are produced during the scan. The pulse generator module 38 can also receive patient data from a physiological acquisition controller 44 that receives signals from a number of different sensors connected to the patient, such as ECG signals from electrodes attached to the patient. And finally, the pulse generator module 38 connects to a scan room interface circuit 46 which receives signals from various sensors associated with the condition of the patient and the magnet system. It is also through the scan room interface circuit 46 that a patient positioning system 48 receives commands to move the patient to the desired position for the scan.

The gradient waveforms produced by the pulse generator module 38 are applied to the gradient amplifier system 42 having Gx, Gy, and Gz amplifiers. Each gradient amplifier excites a corresponding physical gradient coil in a gradient coil assembly generally designated 50 to produce the magnetic field gradients used for spatially encoding acquired signals. The gradient coil assembly 50 forms part of a magnet assembly 52 which includes a polarizing magnet 54 and a whole-body RF coil 56. A transceiver module 58 in the system control 32 produces pulses which are amplified by an RF amplifier 60 and coupled to the RF coil 56 by a transmit/receive switch 62. The resulting signals emitted by the excited nuclei in the patient may be sensed by the same RF coil 56 and coupled through the transmit/receive switch 62 to a preamplifier 64. The amplified MR signals are demodulated, filtered, and digitized in the receiver section of the transceiver 58. The transmit/receive switch 62 is controlled by a signal from the pulse generator module 38 to electrically connect the RF amplifier 60 to the coil 56 during the transmit mode and to connect the preamplifier 64 to the coil 56 during the receive mode. The transmit/receive switch 62 can also enable a separate RF coil (for example, a surface coil) to be used in either the transmit or receive mode.

The MR signals picked up by the RF coil 56 are digitized by the transceiver module 58 and transferred to a memory module 66 in the system control 32. A scan is complete when an array of raw k-space data has been acquired in the memory module 66. This raw k-space data is rearranged into separate k-space data arrays for each image to be reconstructed, and each of these is input to an array processor 68 which operates to Fourier transform the data into an array of image data. This image data is conveyed through the serial link 34 to the computer system 20 where it is stored in memory, such as disk storage 28. In response to commands received from the operator console 12, this image data may be archived in long term storage, such as on the tape drive 30, or it may be further processed by the image processor 22 and conveyed to the operator console 12 and presented on the display 16.

Figure 2:
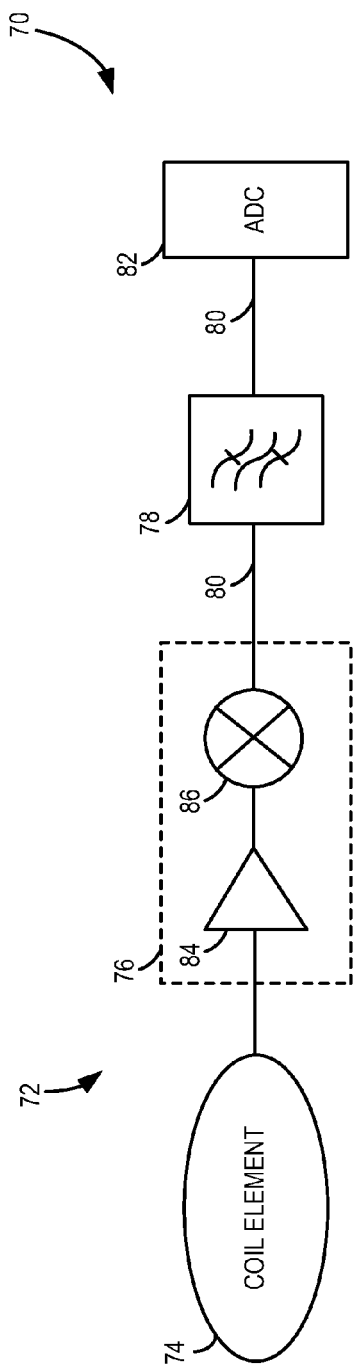
FIG. 2 is a schematic block diagram of an MR surface coil assembly according to an embodiment of the invention.

Referring now to FIG. 2, a simplified schematic block diagram of an MR signal transmission path 70 for an MRI system in accordance with an embodiment of the invention. Transmission path 70 is compatible with the above-described MRI system of FIG. 1 or any similar or equivalent system for obtaining MR images. Transmission path 70 includes an MR surface coil assembly 72, which includes an RF coil element 74 and a frequency translating assembly 76. Transmission path 70 also includes a filter 78, a transmission line 80, and a digitizer 82. RF coil element 74 may be, for example, a whole-body RF coil, a surface coil, a head coil, a coil in an array of coils, etc. and is configured to detect signals emitted from an imaging subject in response to magnetic fields and RF pulses applied to the imaging subject. RF coil element 74 is coupled to and is in signal communication with frequency translating assembly 76, which includes a preamplifier 84 and a frequency translating element 86, such as an oscillator or mixer.

The signals detected by RF coil element 74 are provided to frequency translating assembly 76 at the received resonance frequency (i.e., Larmor frequency), which is dependent on the nuclei being imaged and the field strength of the magnet. The Larmor frequency may be, for example, approximately 63 MHz. Preamplifier 84 receives the signals from RF coil element 74, amplifies the signals, and transmits the signals to mixer 86, which translates the frequency of the amplified signals by an offset frequency. Specifically, mixer 86 alters the frequency of the amplified signals such that the signals are significantly separated from the Larmor frequency. For example, mixer 86 may decrease the frequency of the amplified signals by applying an offset frequency, such as, for example, approximately 60 MHz, thereby decreasing the frequency of the amplified signals to approximately 3 MHz. Alternatively, mixer 86 may apply an offset frequency, such as, for example, approximately 500 MHz, to increase the frequency of the amplified signals to approximately 563 MHz. According to one embodiment of the invention, an offset frequency within a range of approximately 300 MHz to 2.2 GHz may be applied to increase the frequency of the amplified signals. However, because an examination room is typically shielded up to 1 GHz, for example, it may be advantageous to select an offset frequency such that the translated frequency of the signals remains within the shielding effect of the examination room.

After mixer 86 translates the frequency of the MR signals, the signals are transmitted via transmission line 80 through filter 78, which is configured to minimize common mode current interference present in the frequency-translated signals. Transmission line 80 may be an RF cable, for example, or a RF transmission medium such as a strip line on a printed circuit board, for example. According to one embodiment of the invention, filter 78 is a common mode current blocking filter, such as, for example, a notch filter or a high-pass filter. Alternatively, filter 78 may comprise a series of individual notch or high-pass filters, as described below with respect to FIG. 3. Digitizer 82, such as, for example, an analog to digital converter, receives the filtered signals.

Figure 3:
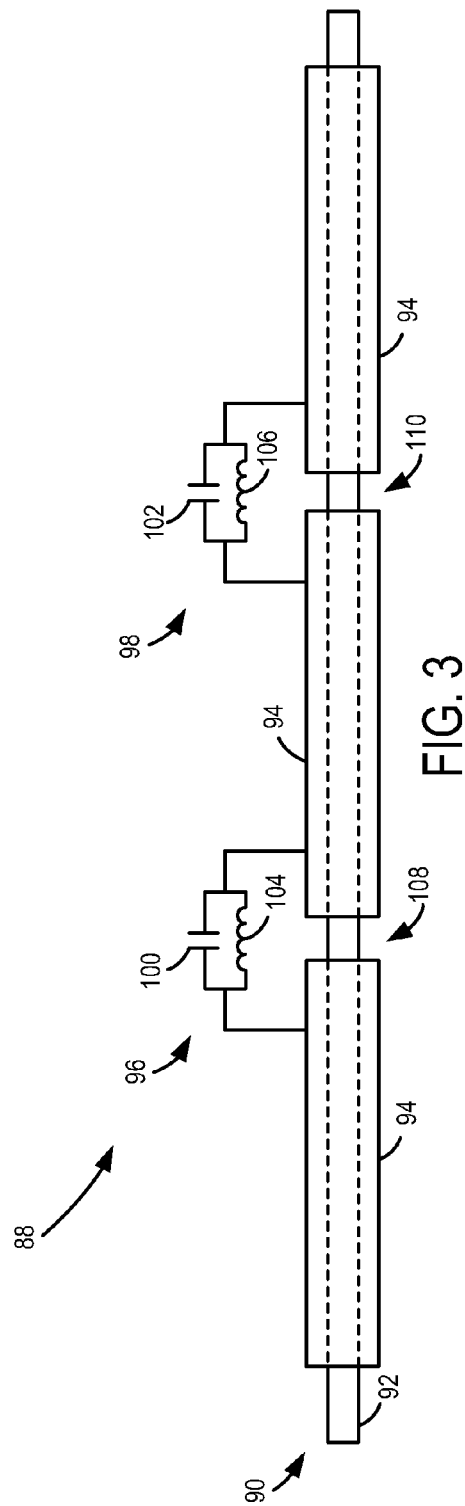
FIG. 3 is a schematic of a filter assembly according to an embodiment of the invention.

FIG. 3 shows a schematic of a filter assembly 88 according to an embodiment of the invention. Filter assembly 88 is coupled to a transmission line 90, such as transmission line 80 of FIG. 2. Transmission line 90 includes a signal line 92 and an outer shield 94. As shown, filter assembly 88 includes filters 96, 98, each having a respective capacitor 100, 102 and a respective inductor 104, 106. Each filter 96, 98 is coupled to transmission line 90 at a respective break 108, 110 in outer shield 94 of transmission line 80.

While filter assembly 88 is shown in FIG. 3 with two filters, it is contemplated that filter assembly 88 may include any number of filters spaced along transmission line 90. Furthermore, while filters 96, 98 are shown as notch filters, filters 96, 98 may be high-pass filters, each comprising a capacitor without an inductor.

Figure 4:
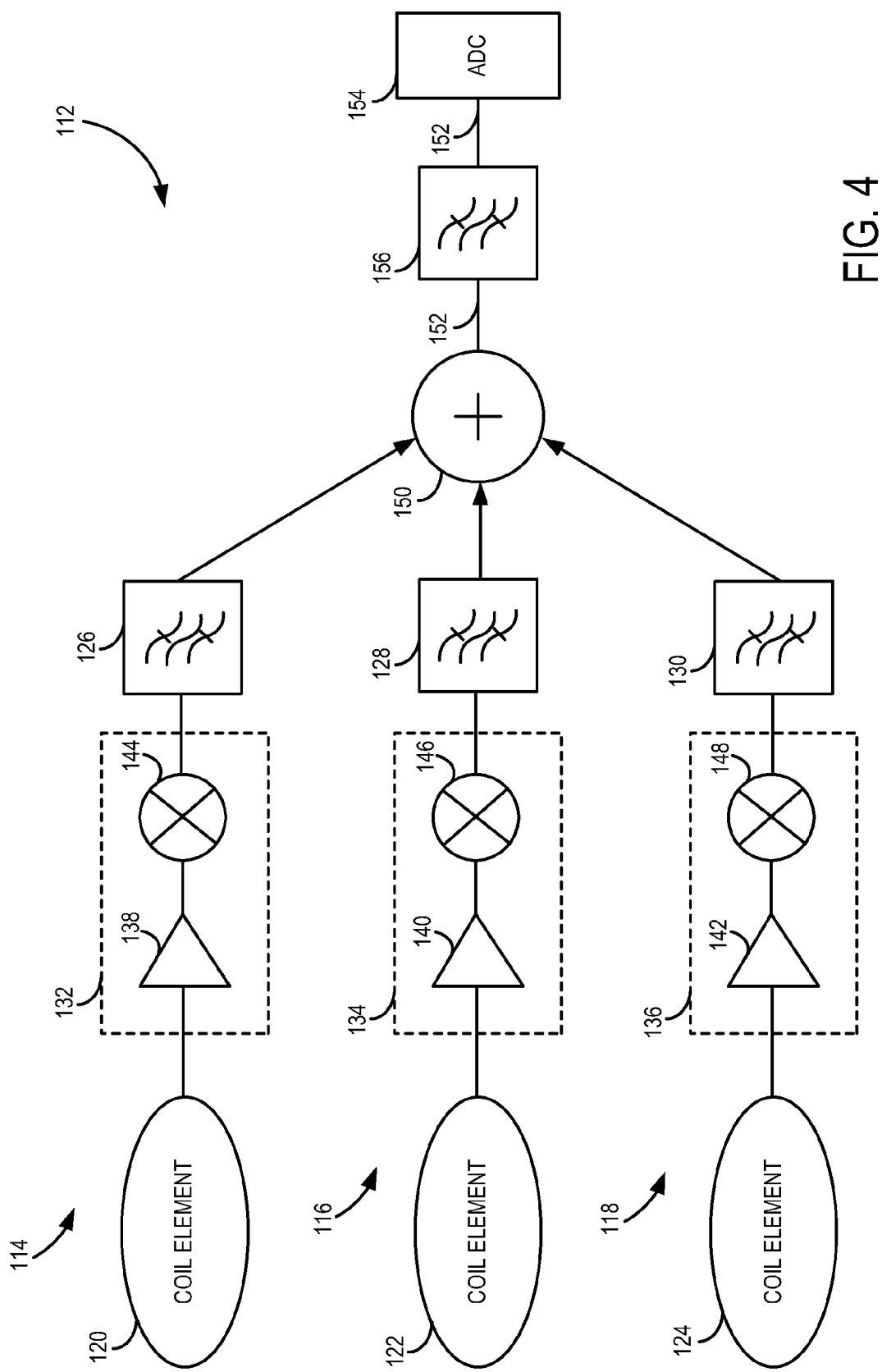
FIG. 4 is a schematic block diagram of an MR surface coil assembly according to another embodiment of the invention.

Referring now to FIG. 4, a simplified schematic block diagram of an MR signal transmission path 112 for a multiple-coil MRI system in accordance with an embodiment of the invention. Transmission path 112 includes a coil-specific transmission path 114, 116, 118 associated with a respective coil element 120, 122, 124. Each coil-specific transmission path 114, 116, 118 includes a respective coil-specific filter 126, 128, 130 and a respective frequency translating assembly 132, 134, 136. Each frequency translating assembly 132-136 includes a respective preamplifier 138, 140, 142 and a respective mixer 144, 146, 148. While three coil elements are shown in FIG. 4, it is contemplated that MR signal transmission path 112 may include any number of coil elements.

Each coil element 120-124 acquires an MR signal at a defined output frequency or Larmor frequency (e.g., approximately 63 MHz) and transmits the MR signal to its respective frequency translating assembly 132-136. After preamplification, the MR signal is input to respective mixer 144-148, wherein a frequency offset is applied to separate the frequency of each respective coil-specific transmission path 114-118 from both the frequency at which the MR signal is acquired (i.e., the Larmor frequency) and from the frequency of each of the other coil-specific transmission paths 114-118. Specifically, coil element 120 transmits an MR signal to frequency translating assembly 132, wherein mixer 144 translates the MR signal with a first offset value such that filter 126 receives a frequency-translated signal at a first translated frequency. Likewise, coil element 122 transmits an MR signal to frequency translating assembly 134, wherein mixer 146 translates the MR signal with a second offset value. Finally, coil element 124 transmits an MR signal to frequency translating assembly 136, wherein mixer 148 translates the MR signal with a third offset value. According to one embodiment, the second offset value may be the sum of the first offset value (applied to the first coil-specific transmission path 114) and a pre-defined channel spacing value such as, for example, 50 MHz. Likewise, the third offset value may be the sum of the second offset value and the pre-defined channel spacing value. In this manner, mixers 144-148 may translate respective MR signals to 563 MHz, 613 MHz, and 663 MHz, for example. According to embodiments of the invention, frequency values for the translated MR signals may be within a range of approximately 300 MHz to 2.2 GHz. Thus, mixers 144-148 frequency translate the MR signal such that each transmission path 114-118 has a channel-specific translated frequency associated therewith, which is separated from the defined or Larmor frequency of the acquired MR signal.

A combiner 150 receives the frequency-translated MR signals from mixers 144-148 and combines the signals into a common signal. Combiner 150 then transmits the signals via a transmission line 152 to a digitizer 154. A common mode filter 156, similar to that described with respect to FIG. 3, is coupled to transmission line 152.

While MR signal transmission path 112 shown in FIG. 4 includes both common mode filter 156 and coil-specific filters 126-130, it is contemplated that common mode filter 156 may be omitted from MR signal transmission path 112 in an embodiment of the invention. Alternatively, according to another embodiment of the invention, MR signal transmission path 112 may include coil-specific filters 126-130 while omitting common mode filter 156.

Therefore, by frequency translating or spatially separating RF signals received from RF coil elements from the Larmor frequency, common filtering technique may be employed to filter unwanted common mode currents generated on electrically conductive transmission lines within the magnetic field area of an MRI system. Thus, common filters, such as, for example, notch filters or high-pass filters, may be used in place of baluns, common mode chokes, and/or cable traps, thereby decreasing the complexity of common mode blocking hardware and reducing parts and labor costs associated with the MRI system. Further, spatially separated RF signals may be combined in a single RF channel, which may be digitized using a single digitizer. Use of a single digitizer allows all concurrent channel filtering, demodulation, and detection to be performed in software, thereby reducing hardware costs and improving reproducibility through the use of software-defined circuit functions.

Therefore, in accordance with one embodiment of the present invention, an apparatus includes a first magnetic resonance (MR) coil element configured to output a first set of MR data at a first output frequency and a first mixer coupled to the first MR coil element. The first mixer is configured to receive the first set of MR data from the first MR coil element and frequency translate the first set of MR data to a first offset frequency different from the first output frequency by a first offset value. The apparatus also includes a digitizer coupled to the first mixer and configured to convert the frequency-translated first set of MR data into a set of digital data and a transmission line coupled to the first mixer and to the digitizer, the transmission line configured to transmit the frequency-translated first set of MR data from the MR coil element to the digitizer without a balun coupled to the transmission line.

In accordance with another embodiment of the present invention, an MR system includes a magnetic resonance imaging (MRI) apparatus having a plurality of gradient coils positioned about a core of a magnet to impress a polarizing magnetic field and an RF transceiver system and an RF switch controlled by a pulse module to transmit RF signals to a balun-less RF coil assembly to acquire MR images. The balun-less RF coil assembly includes a plurality of RF coils and a frequency translating element, which is configured to receive an MR signal from an RF coil of the plurality of RF coils and alter a frequency of the MR signal by an offset from the frequency of the MR signal. The MR system also includes a combiner configured to receive the frequency-altered MR signal, a balun-less transmission line configured to filter the frequency-altered MR signal, and a digitizer configured to receive the frequency-altered MR signal from the balun-less transmission line.

In accordance with yet another embodiment of the present invention, a method of manufacturing an apparatus includes providing a first magnetic resonance (MR) coil element configured to output a first set of MR data at a first frequency. The method also includes coupling a first mixer to the first MR coil element and configuring the first mixer to receive the first set of MR data from the first MR coil element and frequency translate the first set of MR data to a first offset frequency different from the first frequency by a first offset value. The method further includes coupling a digitizer to the first mixer and configuring the digitizer to convert the frequency-translated first set of MR data into a set of digital data, coupling a transmission line to the first mixer and to the digitizer, and configuring the transmission line to transmit the frequency-translated first set of MR data from the MR coil element to the digitizer without a balun coupled to the transmission line.

The present invention has been described in terms of the preferred embodiment, and it is recognized that equivalents, alternatives, and modifications, aside from those expressly stated, are possible and within the scope of the appending claims.

What is claimed is:

1. An apparatus comprising:
a first magnetic resonance (MR) coil element configured to output a first set of MR data at a first output frequency;
a first mixer coupled to the first MR coil element and configured to:
receive the first set of MR data from the first MR coil element; and
frequency translate the first set of MR data to a first offset frequency different from the first output frequency by a first offset value;
a signal processor coupled to the first mixer and configured to generate image data corresponding to the frequency-translated first set of MR data, wherein the signal processor comprises a digitizer configured to receive and convert the frequency-translated first set of MR data into a set of digital data; and
a transmission line coupled to the first mixer and to the signal processor and configured to transmit the frequency-translated first set of MR data from the MR coil element to the signal processor without a balun coupled to the transmission line.

2. The apparatus of claim 1 wherein the first output frequency is a Larmor frequency.

3. The apparatus of claim 1 wherein the first offset value is approximately 200 MHz.

4. The apparatus of claim 1 wherein the digitizer is an analog to digital converter.

5. The apparatus of claim 1 further comprising:
a second MR coil element configured to output a second set of MR data at a second output frequency;
a second mixer coupled to the second MR coil element and configured to:
receive the second set of MR data from the second MR coil element; and
frequency translate the second set of MR data to a second offset frequency different from the second output frequency by a second offset value;
a combiner having:
a first input coupled to the first mixer;
a second input coupled to the second mixer; and
an output coupled to the digitizer;
wherein the combiner is configured to combine the frequency-translated first and second sets of MR data into a combined MR data signal and to transmit the combined MR data signal to the digitizer via the transmission line; and
wherein the digitizer is further configured to convert the combined MR data signal into the set of digital data.

6. The apparatus of claim 5 wherein the first offset value is offset from the second offset value by a pre-defined channel spacing value.

7. The apparatus of claim 5 further comprising a common filter coupled to the transmission line and configured to filter the combined frequency-translated first and second sets of MR data.

8. The apparatus of claim 7 further comprising:
a first filter coupled to the first mixer and to the combiner and configured to filter the frequency-translated first set of MR data; and
a second filter coupled to the second mixer and to the combiner and configured to filter the frequency-translated second set of MR data.

9. The apparatus of claim 1 further comprising a filter coupled to the first mixer and configured to filter the frequency-translated first set of MR data.

10. The apparatus of claim 9 wherein the filter is configured to filter common mode current from the transmission line.

11. The apparatus of claim 9 wherein the filter is one of a high-pass filter and a notch filter.

12. A method of manufacturing an apparatus comprising:
providing a first magnetic resonance (MR) coil element configured to output a first set of MR data at a first frequency;
coupling a first mixer to the first MR coil element and configuring the first mixer to:
receive the first set of MR data from the first MR coil element; and
frequency translate the first set of MR data to a first offset frequency different from the first frequency by a first offset value;
coupling a signal processor to the first mixer and configuring the signal processor to generate image data from the frequency-translated first set of MR data;
coupling a transmission line to the first mixer and to the signal processor; and configuring the transmission line to transmit the frequency-translated first set of MR data from the MR coil element to the signal processor without a balun coupled to the transmission line.

13. The method of claim 12 further comprising:

providing a plurality of MR coil elements configured to output a plurality of sets of MR data at the first frequency; and coupling a plurality of mixers to the plurality of MR coil elements and configuring each of the plurality of mixers to frequency translate the plurality of sets of MR data to a respective offset frequency different from the first frequency, the respective offset frequency comprising a base offset and a distinct channel spacing offset such that a translated frequency of each of the plurality of sets of MR data differs from a translated frequency of each other of the plurality of sets of MR data by at least the distinct channel spacing offset.

14. The method of claim 13 further comprising coupling a combiner to the plurality of mixers and configuring the combiner to receive and combine the plurality of frequency-translated channels of MR signals; and wherein configuring the signal processor further comprises configuring the signal processor to convert the combined plurality of frequency-translated channels of MR data into the image data.

15. The method of claim 12 further comprising coupling a filter to the transmission line and configuring the filter to filter common mode current.

* * * * *